United States Patent [19]

Davis

[11] Patent Number: 4,624,724
[45] Date of Patent: Nov. 25, 1986

[54] METHOD OF MAKING INTEGRATED CIRCUIT SILICON DIE COMPOSITE HAVING HOT MELT ADHESIVE ON ITS SILICON BASE

[75] Inventor: Gary C. Davis, Albany, N.Y.

[73] Assignee: General Electric Company, Schenectady, N.Y.

[21] Appl. No.: 692,088

[22] Filed: Jan. 17, 1985

[51] Int. Cl.⁴ .................................... B32B 31/18
[52] U.S. Cl. .................... 156/264; 156/265; 156/329; 427/240; 427/289
[58] Field of Search ............. 156/250, 256, 264, 265, 156/299, 329; 29/576 S, 577 C, 583, 589, 590, 830, 831, 832; 427/208.2, 240, 289; 524/588

[56] References Cited

U.S. PATENT DOCUMENTS

| | | | |
|---|---|---|---|
| 3,600,246 | 8/1971 | Breen | 156/265 |
| 4,011,279 | 3/1977 | Berger et al. | 524/588 |
| 4,347,302 | 8/1982 | Gotman | 427/240 |
| 4,385,083 | 5/1983 | Shelley | 427/240 |

Primary Examiner—Caleb Weston
Attorney, Agent, or Firm—William A. Teoli; James C. Davis, Jr.; James Magee, Jr.

[57] ABSTRACT

A method is provided for making integrated circuit silicon composite die having a hot melt adhesive on the surface of its silicon base. An integrated circuit silicon wafer silicon composite die in wafer form is diced after a hot melt adhesive has been applied onto its silicon base utilizing a spin coating procedure. Integrated circuit silicon composite arrays are also provided by integrally bonding the integrated circuit silicon die onto a carrier substrate.

3 Claims, 3 Drawing Figures

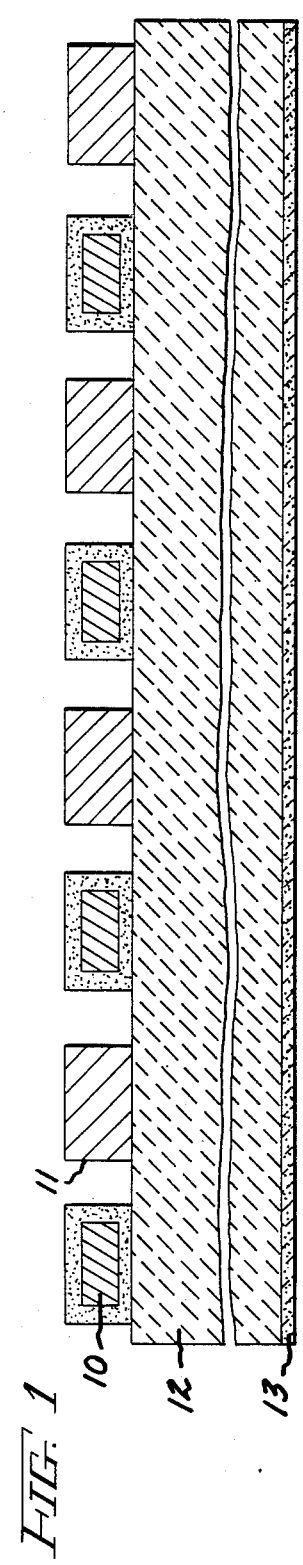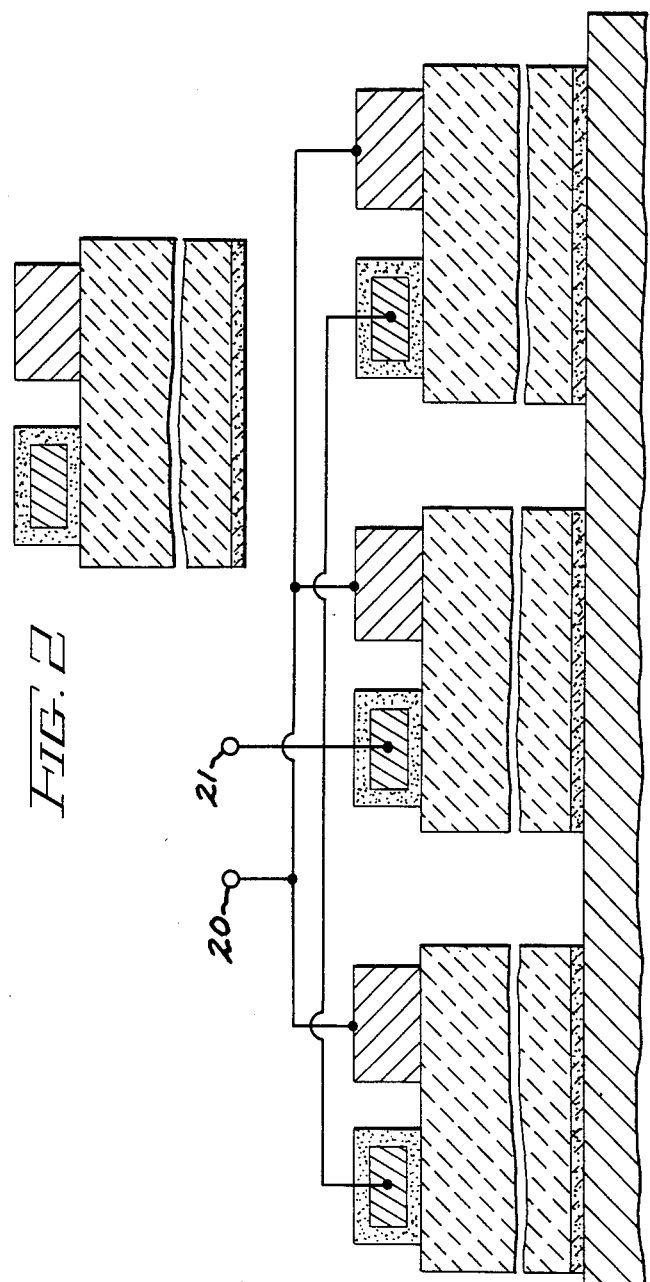

4,624,724

METHOD OF MAKING INTEGRATED CIRCUIT SILICON DIE COMPOSITE HAVING HOT MELT ADHESIVE ON ITS SILICON BASE

BACKGROUND OF THE INVENTION

Prior to the present invention, integrated circuit silicon die composite was generally made by dicing a silicon wafer having a plurality of integrated circuits on its surface. The die in wafer form was generally diced by using a diamond scribe, a laser scribe or a diamond saw. The integrated die composite was then bonded onto various conducting or non-conducting substrates to produce an integrated circuit array. Application of the integrated circuit silicon die composite onto the carrier was generally achieved by applying an adhesive onto the silicon base of the integrated die composite which was then placed in an appropriate location onto the carrier. Another technique involved the employment of an adhesive directly onto the carrier substrate and the bonding thereon of the integrated circuit die. Although the procedure for applying adhesive onto the carrier array substrate achieved effective results, the adhesive often contained an organic solvent which was detrimental to adjacent components on the carrier substrate. An alternative procedure of applying the adhesive directly onto the base of an integrated circuit silicon composite also was effective but uneconomic.

The present invention is based on the discovery that an organic solvent solution of a hot melt adhesive, preferably a polyetherimidesiloxane, defined more particularly hereinafter, can be spun onto the back side of the integrated die while in wafer form and thereafter dried; the resulting integrated circuit die in wafer form thereafter can be diced. A diamond scribe or diamond saw can be used to produce a plurality of integrated circuit silicon composite dies having a hot melt adhesive on their respective silicon bases.

STATEMENT OF THE INVENTION

There is provided by the present invention, a method which comprises,
(1) spin coating an organic solvent solution of a hot melt adhesive onto the base of a silicon wafer having a plurality of integrated circuits on its upper surface,
(2) drying the applied hot melt adhesive and
(3) dicing the silicon wafer to produce a plurality of integrated circuit silicon die composites having a hot melt adhesive layer on their respective bases.

In another aspect of the present invention, there is provided a method for bonding integrated circuit silicon composite onto the surface of a substrate which comprises,
(1) contacting the surface of the substrate with the base of at least one integrated circuit silicon composite die which has been treated with a hot melt adhesive,
(2) warming the the hot melt adhesive while the integrated circuit silicon composite die is in contact with the substrate surface and
(3) allowing the hot melt adhesive to cool to effect the bonding of the integrated circuit composite die to the carrier substrate.

Reference is made to FIG. 1 showing a sectional view of an integrated circuit die in wafer form coated on its base with a hot melt adhesive.

FIG. 2 shows an integrated circuit composite die made by cutting the die in wafer form of FIG. 1.

FIG. 3 is an array of integrated circuit silicon die composites integrally bound onto the surface of a carrier with appropriate electrical connections.

More particularly, there is shown in FIG. 1 at 10 an insulated gate electrode, at 11 a signal electrode, at 12 a silicon substrate and at 13, a hot melt adhesive layer.

In FIG. 3, there is shown at 20, at main signal electrode and at 21, a control gate electrode.

Hot melt adhesive which can be utilized in the practice of the present invention is preferably polyetherimidesiloxane which is described by Berger and Juliano, U.S. Pat. No. 4,011,279, assigned to the same assignee as the present invention and incorporated herein by reference. Additional hot melt adhesives which can be utilized in the practice of the invention are any thermoplastic materials which can be softened at a temperature in the range of from about 100° C. to 300° C. and preferably from 150° C. to 200° C. The application of the hot melt adhesive is preferably achieved by spinning an organic solvent solution of the hot melt thermoplastic material. A typical mixture, for example, is a polyetherimide polysiloxane in an organic solvent such as N-methylpyrolidone or diglyme.

In the practice of the present invention, the base of integrated circuit die in wafer form is treated with an organic solvent solution of a hot melt adhesive. The hot melt adhesive is spun onto the back side surface of the silicon wafer at about 2000 to 7000 rpm. The treated wafer is then heated at an initial temperature of about 100° to 120° C. for 30 to 60 minutes and thereafter baked at a temperature of about 180° to 220° C. for 0.5 to 1.0 hours. Typically, there is produced on the surface of the silicon wafer, a hot melt adhesive film having a thickness of from about 0.5 to about 25 microns.

The silicon wafer is then diced utilizing, for example, a diamond scribe, laser, or saw, to produce a plurality of integrated circuit silicon composite dies.

An integrated circuit array can thereafter be assembled by using one or more of the aforesaid integrated circuit silicon composite die on a carrier, such as a non-conducting substrate, for example, alumina or beryllia, or a conducting substrate, such as aluminum or copper. Upon applying heat to the hot melt adhesive in a localized manner at the base of the integrated circuit composite, at temperatures in the range of from 100° C. to 300° C., the composite can integrally bound to the carrier substrate upon cooling. Appropriate connections can then be made to produce an integrated circuit silicon composite array as shown by FIG. 3.

In order that those skilled in the art will be better able to practice the present invention, the following examples is given by way of illustration and not by way of limitation. All parts are by weight.

EXAMPLE 1

A 10 mil silicon wafer having a diameter of 3 inches and a plurality of integrated circuit silicon composites on its surface was treated with a fully imidized polyetherimidesiloxane on its back surface. The polyetherimidesiloxane had chemically combined blocks of polydimethylsiloxane attached to bisphenol-A imide groups through propylene linkages. There was utilized a solution of the polyetherimidesiloxane in diglyme. After spin coating the polyetherimidesiloxane at 2000 rpm for 30 seconds, the wafer was dried for ½ hour at 120° C. followed by a 2½ hour heat treatment at 150° C. There was obtained an integrated circuit composite in wafer form having a 15 micron polyetherimide coating on its base. The wafer was then diced using a Microautomation Model 1006A diamond saw to produce fifty 100 mil diameter integrated circuit silicon die composites.

An integrated circuit silicon composite array was made with several of the integrated circuit silicon composite dies by placing them in contact with a alimina substrate. The die was held in contact with the substrate so that the polyetherimidesiloxane could be raised to a temperature of about 200° C. allowing the polyetherimidesiloxane to soften and thereafter allowing the bonding of the integrated circuit die to the carrier surface upon cooling. A useful integrated circuit silicon composite array was then made by respectively joining the gate electrodes and the main signal electrodes of the various integrated circuits.

Although the above example is directed to only a few of the very many variables which can be used in the practice of the method of the present invention, it should be understood that the present invention is directed to a much broader variety of hot melt adhesives.

What I claim as new and desire to secure by Letters Patent of the United States is:

1. A method which comprises
   (1) spin coating at about 2000 to 7000 rpm an organic solvent solution of a hot melt adhesive onto the base of a silicon wafer having a plurality of integrated circuits on its upper surface,
   (2) drying the applied hot melt adhesive at an initial temperature of about 100° to 120° C., and thereafter at a temperature of about 180° to 220° C., and
   (3) dicing the silicon wafer to produce a plurality of integrated circuit silicon die composites having a hot melt adhesive layer on their respective bases.

2. A method which comprises
   (1) spin coating at about 2000 to 7000 rpm an organic solvent solution of a polyetherimide siloxane into the base of a silicon wafer having a plurality of integrated circuits on its upper surface,
   (2) drying the applied polyetherimide siloxane at an initial temperature of about 100° to 120° C., and thereafter at a temperature of about 180° to 220° C., and
   (3) dicing the silicon wafer to produce a plurality of integrated circuit silicon die composites having a polyetherimide siloxane layer on their respective bases.

3. A method in accordance with claim 1, where several integrated circuit silicon die composites are used to form an integrated circuit silicon composite array by bonding them on a alumina substrate.

* * * * *